United States Patent [19]

Black et al.

[11] Patent Number: 5,140,286
[45] Date of Patent: Aug. 18, 1992

[54] OSCILLATOR WITH BIAS AND BUFFER CIRCUITS FORMED IN A DIE MOUNTED WITH DISTRIBUTED ELEMENTS ON CERAMIC SUBSTRATE

[75] Inventors: Gregory R. Black, Vernon Hills; Alexander W. Hietala, Cary; Darioush Agahi-Kesheh, Buffalo Grove, all of Ill.

[73] Assignee: Motorola, Inc., Schaumburg, Ill.

[21] Appl. No.: 739,573

[22] Filed: Aug. 2, 1991

[51] Int. Cl.⁵ .................. H03B 5/12; H03B 5/18; H03L 1/00
[52] U.S. Cl. .................. 331/99; 331/108 D; 331/117 D; 331/177 V; 331/186; 361/400; 361/406; 455/76; 455/87
[58] Field of Search .................. 331/99, 108 C, 108 D, 331/117 R, 117 D, 177 V, 185, 186; 455/75, 76, 87; 361/395, 397, 400, 406

[56] References Cited

U.S. PATENT DOCUMENTS 3,665,342 5/1972 Reed .................. 331/117 R X
5,068,714 11/1991 Seipler .................. 361/400 X Primary Examiner—Siegfried H. Grimm
Attorney, Agent, or Firm—Kirk W. Dailey; Robert W. Kelly

[57] ABSTRACT

A voltage controlled oscillator and buffer amplifier circuit (211) is disclosed. The circuit is in a stacked configuration, whereby, the current from the power supply (361) is used by the buffer amplifier circuit and reused by the VCO circuit. The VCO circuit includes two transistors (333, 325). The transistors are set-up in a mirrored configuration, so that one of the transistors (325) controls the bias current in the other transistor (333). Both of the transistors are integrated into a semiconductor circuit die (365), thus, matching the thermal characteristics of the transistors (333, 325) and improving control of the bias current. The die (365) is bonded to a ceramic substrate (601). The substrate (601) has connectivity paths for connecting components in the circuit die to components external to the circuit die. Some of the connectivity paths are made of a material and length to form passive circuit elements.

25 Claims, 3 Drawing Sheets

5,140,286

OSCILLATOR WITH BIAS AND BUFFER CIRCUITS FORMED IN A DIE MOUNTED WITH DISTRIBUTED ELEMENTS ON CERAMIC SUBSTRATE

FIELD OF THE INVENTION

This invention relates generally to oscillators and more specifically to integrated voltage controlled oscillators (VCO).

BACKGROUND OF THE INVENTION

Generally, voltage controlled oscillators are used in many applications which include, but are not limited to, radiotelephones. Currently in radiotelephones, the VCO is used as a frequency source for both the receiver and the transmitter. With the VCO phase locked to a desired frequency, the frequency signal generated by the VCO is used to modulate and demodulate data signals at radio frequencies. As radiotelephones become smaller and more portable, there is a growing need for the VCO to use power efficiently, operate at low power supply voltages and produce a high signal to noise ratio.

Presently, the VCO designs of interest include a stacked arrangement of a buffer amplifier and a VCO. In this stacked configuration, the power supply is serially coupled to the buffer amplifier and the VCO. This arrangement reuses the current from the buffer amplifier to power the VCO. The buffer amplifier also functions as a power supply filter for the VCO. However, in this arrangement, any voltage drop in either the buffer amplifier or the VCO will limit the range of supply voltage available to the VCO. A large supply voltage range is important in maintaining a high signal to noise ratio and sufficient output signal power.

FIG. 1 is a schematic of a VCO in the stacked configuration. Here, transistor 135 in conjunction with the common resonator circuitry attached to the transistor's collector acts as the oscillator 151. The resistor 133 attached to the emitter of the transistor 135 is used to control the amount of bias current which flows from the emitter of transistor 135. The resistor 133 causes a voltage drop, subsequently, reducing the available range of supply voltage. Capacitor 115 couples the oscillated signal to the buffer amplifier 153.

The buffer amplifier 153 includes the transistors 111 and 113. The buffer amplifier 153 amplifies the signal which is generated by the VCO 151 and coupled to the buffer amplifier 153 through the capacitor 115. Additionally, the buffer amplifier may serve as an additional filter of the power supply 155 which is fed to the VCO 151, which is the subject of U.S. patent application Ser. No. 685,248, "Apparatus for Filtering and Amplifying an Oscillator", filed on behalf of Hietala et. al, on Apr. 15, 1991 and assigned to the assignee of the present invention. However, further isolation of the VCO from the power supply and the buffer amplifier would be beneficial to the oscillator by making the output frequency of the oscillator less susceptible to fluctuations of the voltage of the power supply 155 and load impedance variations at the output of the buffer amplifier 153.

Therefore, a need exists for a VCO which can effectively operate at low power supply voltages while maintaining a high signal to noise ratio, which also has superior isolation from the fluctuations in voltage of the power supply 155 and load impedance of the buffer amplifier 153.

SUMMARY OF THE INVENTION

The present invention encompasses an electrical circuit containing an oscillator for generating a signal of a desired frequency. The oscillator includes:
1) a semiconductor circuit die;
2) a ceramic substrate bonded to the die. The ceramic substrate has connectivity paths for connecting components in the circuit die to components external to the circuit die. Some of the connectivity paths are made of a material and length to form passive circuit elements.

DESCRIPTION OF A PREFERRED EMBODIMENT

Figure 2:
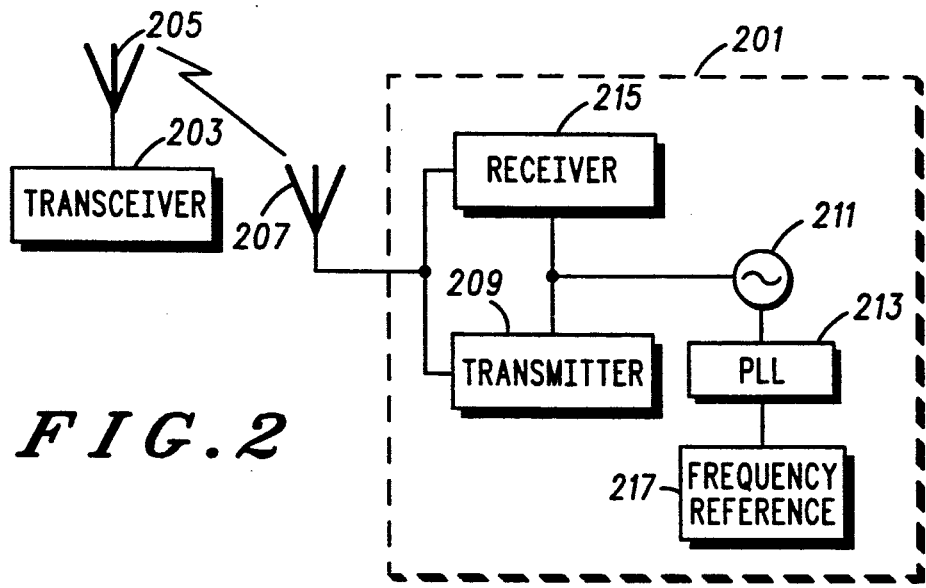
FIG. 2 is a block diagram of a radiotelephone communications system which may employ the present invention.

FIG. 2 is a block diagram of a radiotelephone communication system. This system includes a fixed site transceiver 203 which contains a receiver and a transmitter. The fixed site transceiver 203 receives and transmits radio frequency signals via an antenna 205. This fixed site transceiver 203 provides telephone service to all mobile and portable radiotelephones within a specified geographic area, which includes the portable radiotelephone 201. Radiotelephone 201 transmits radio frequency signals to and receives radio frequency signals from the fixed site transceiver 203. The antenna 207 couples the radio frequency (RF) signals and converts them to electrical radio frequency signals. RF signals received at the antenna 207 are input into the receiver 215. Receiver 215 demodulates the RF signals which have a predetermined carrier frequency. The predetermined carrier frequency is supplied by the voltage controlled oscillator (VCO) and buffer amplifier 211. After the signal is demodulated, the data can be recovered for use by other components contained within the radiotelephone 201.

Upon transmission of data from the radiotelephone 201 to the fixed site transceiver 203, data is input into the transmitter 209 and modulated at a second predetermined frequency. The modulation frequency is supplied by the VCO and buffer amplifier 211. The modulated electrical radio frequency signal is conveyed to the antenna 207 which converts it into a radio frequency signal and sends it to the fixed site transceiver 203. The phase lock loop (PLL) 213 is coupled to the VCO and buffer amplifier 211, the PLL 213 functions as an intermediate device between the frequency reference 217 and the VCO 211. The PLL 213 outputs a voltage to the VCO 211 to control and change the frequency of the VCO 211 as is deemed necessary.

Figure 3:
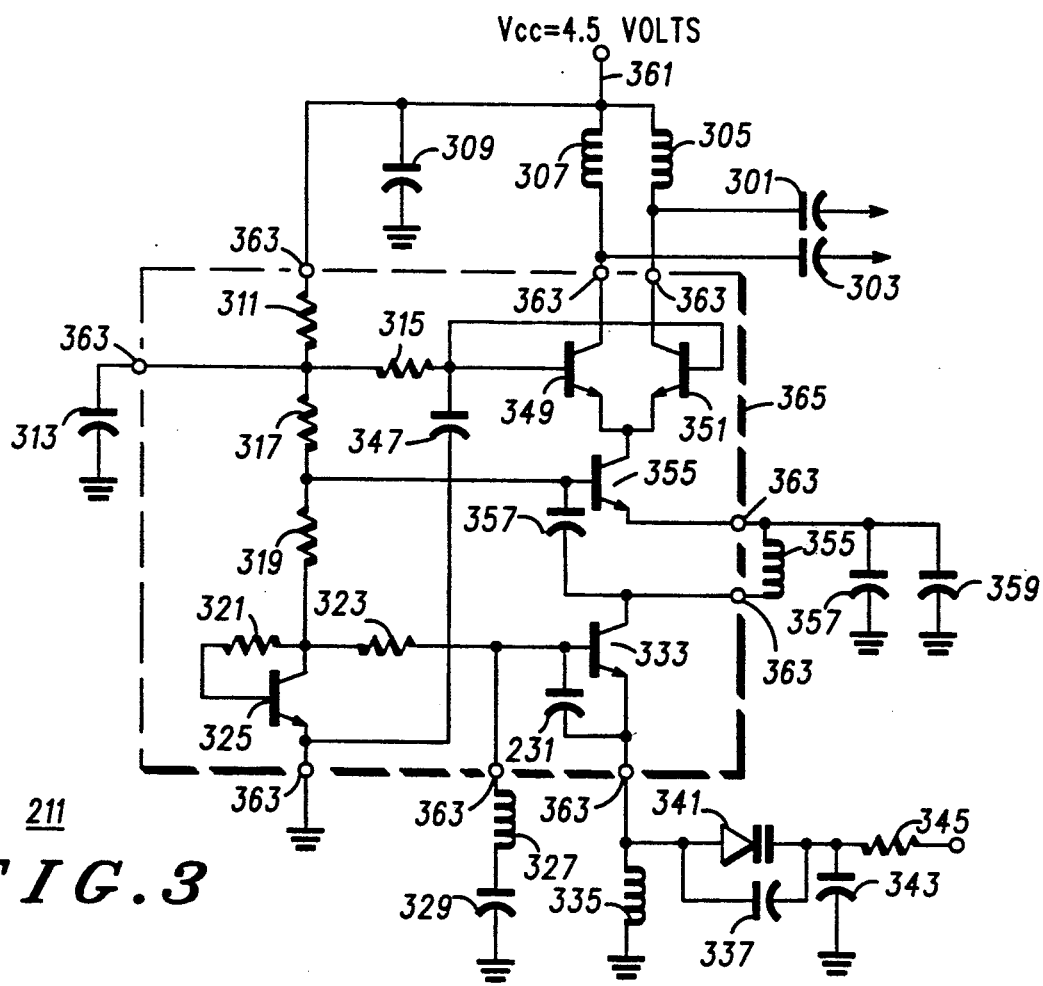
FIG. 3 is a schematic of a buffer amplifier and VCO in a stacked configuration which may employ the present invention.

FIG. 3 is a schematic of the VCO and the buffer amplifier 211 in a stacked configuration. The VCO circuit includes the resonating transistor 333, the bias transistor 325, and the resonator circuit which includes the inductor 335, the varactor diode 341, and the capacitors 343, 337. In the preferred embodiment, the transistors 333, 325 are NPN bipolar transistors. The signal generated by the VCO is coupled to the buffer amplifier with the capacitor 357. The buffer amplifier includes transistors 349, 351, and 355 which are set up in a double ended cascode amplifier configuration, consisting of a common emitter input stage, and two common base output stages connected in parallel.

Figure 1:
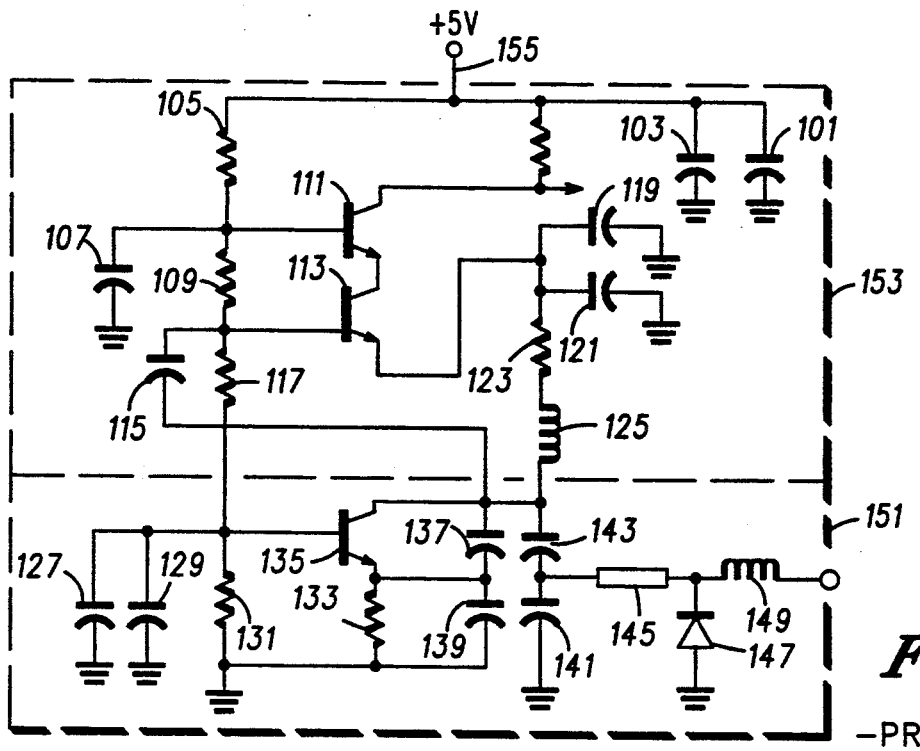
FIG. 1 is a schematic of a buffer amplifier and VCO in a stacked configuration which is prior art.

A resistive element is eliminated from a typical VCO configuration, such as the configuration shown in FIG. 1. Typically, as shown in FIG. 1, the emitter of the resonating transistor 135 is coupled to electrical ground through a resistor 133 to control the bias current for the resonator. By using mirrored transistors 325, 333, the bias current can be controlled by the bias transistor 325, thus, eliminating a need for the resistor on the emitter of the resonating transistor 333. In order for the bias current to be controlled effectively, the two transistors 325, 333 must have matching thermal characteristics. In the preferred embodiment, matching the thermal characteristics is accomplished by integrating the two transistors 325, 333 onto the same integrated semiconductor circuit die. Eliminating the resistive element from the power supply path increases the available voltage range of the power supply in the buffer amplifier and the VCO, consequently, a higher power output for a given supply voltage input, and a higher signal to noise ratio in the VCO are obtained.

In the preferred embodiment, a bias current through the resonating transistor 333 is established with bias transistor 325 and the bias resistor string 311, 317, 319 in conjunction with the power supply 361. The DC current in the resonating transistor 333 without any oscillation present, can be calculated as the current through the bias transistor 325 times the ratio of the emitter area of the resonating transistor 333 to the emitter area of the bias transistor 325. The emitter area is the geometrical area occupied by the emitter of a transistor. Making the emitter area of the bias transistor 325 much smaller than the emitter area of the resonating transistor 333, the bias circuit will draw much less current than the oscillator, thus, will be very power efficient. Integrating the two transistors 333, 325 onto the same die results in very close tracking between the two currents flowing through the two transistors 325,333, because the thermal and aging characteristics of the transistors 325,333 will fluctuate together.

Additionally, a resistor (not illustrated) may be tied from the base of the bias transistor 325 to an electrical ground. This would further limit the current in the bias transistor 325 without impeding the current flowing through the resonating transistor 333, thus, creating a more efficient biasing scheme with a potential loss in accuracy of the bias current. This is referred to as a $V_{BE}$ multiplier.

When oscillations are present in the VCO, the collector to emitter voltage of resonating transistor 333 swings between saturation and cut-off voltage of the transistor. During saturation, the resonating transistor 333 will pull down the emitter voltage of the transistor 355 and also the base of the transistor 355. This will tend to reduce the current supplied to the bias transistor 325. Since the resonating transistor 333 receives its base drive from the bias transistor 325, the base drive will be reduced, thus, providing negative bias feedback to reduce the saturation effect. During cutoff, the opposite effect will occur, the bias current from the bias transistor 325 increasing the drive to the resonating transistor 333. Thus, the amplitude of oscillation in the oscillator stage is determined by the emitter voltage of the transistor 355. Thus, removing the resistive element in the emitter of the resonating transistor 333, which caused a voltage drop, has increased the effective emitter voltage of the transistor 355, thus, allowing for a larger voltage swing during the oscillation, subsequently, more power output by the circuit shown in FIG. 3.

In the preferred embodiment, the resonator circuit is coupled to the emitter of the resonating transistor 333. This design further isolates the sensitive components of the VCO from impedance variations of the load on the output of the buffer amplifier. This configuration is referred to as the "resonated emitter" configuration.

Figure 4:
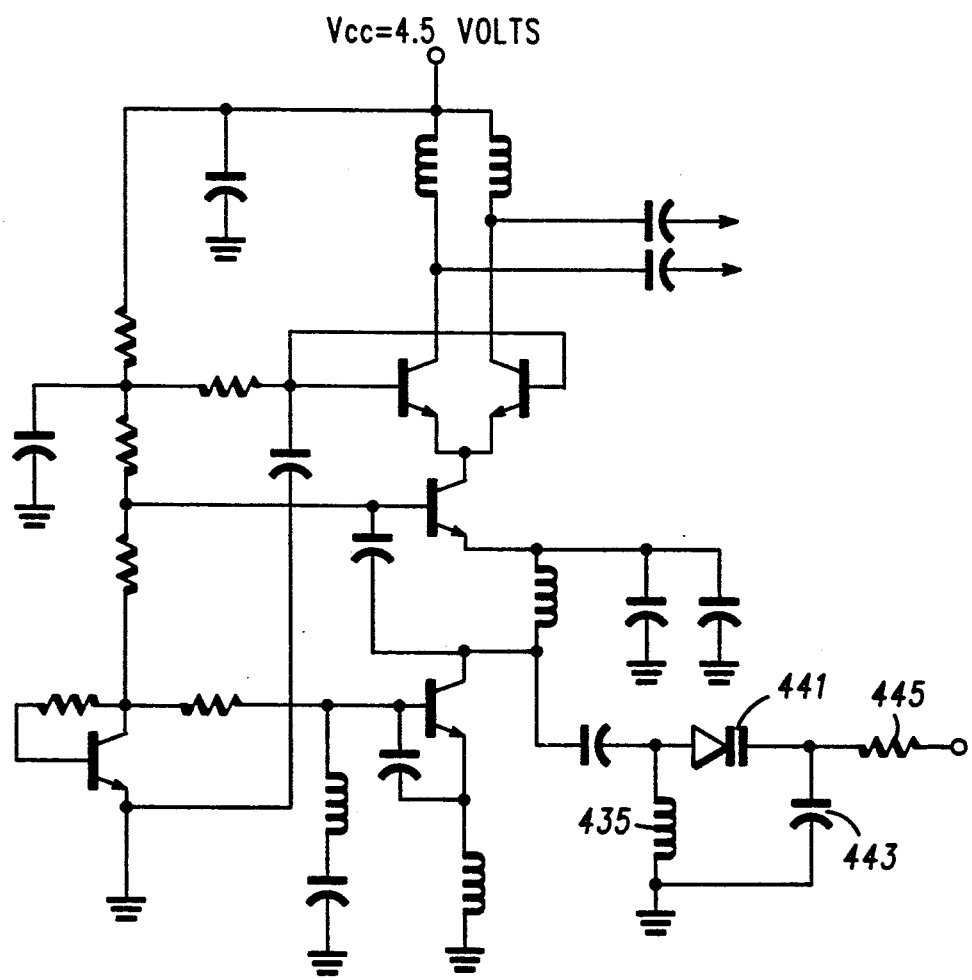
FIG. 4 is an alternate embodiment of the schematic shown in FIG. 3.
Figure 5:
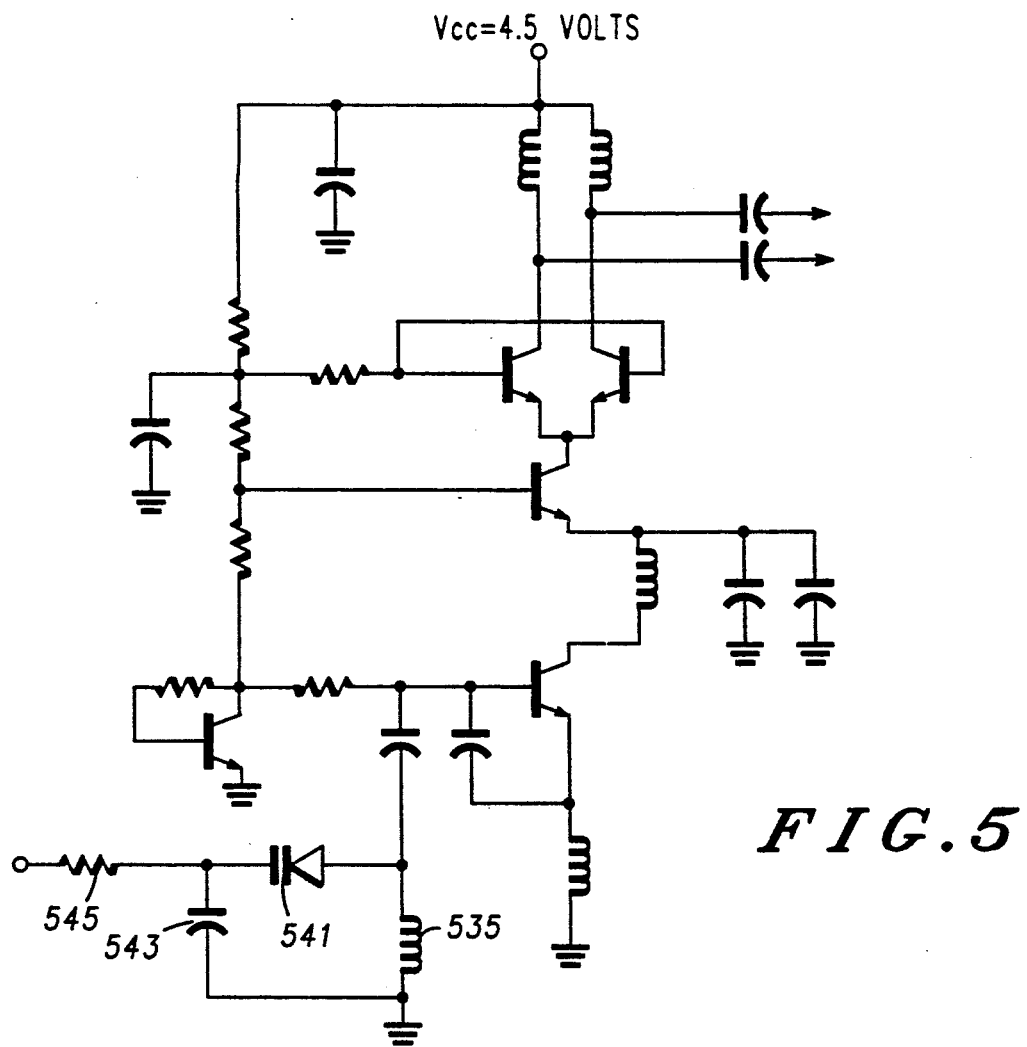
FIG. 5 is an alternate embodiment of the schematic shown in FIG. 3.

The "resonated emitter" configuration is the preferred embodiment because of its superior immunity from frequency shifts due to load impedance variations. However, in applications not requiring such immunity, similar configurations could be employed. These similar configurations are referred to as the "resonated collector" and the "resonated base". FIG. 4 is a schematic of the "resonated collector" embodiment. The topology is substantially identical to the preferred embodiment illustrated in FIG. 3 except that the resonator circuit, including elements 441, 435, 443, and 445, are now connected at the collector of the resonating transistor, 333. FIG. 5 is a schematic of the "resonated base" embodiment. The topology is identical to the preferred embodiment except that the resonator circuit, including elements 541, 535, 543, 545, are connected to the base of the resonating transistor 333.

Figure 6:
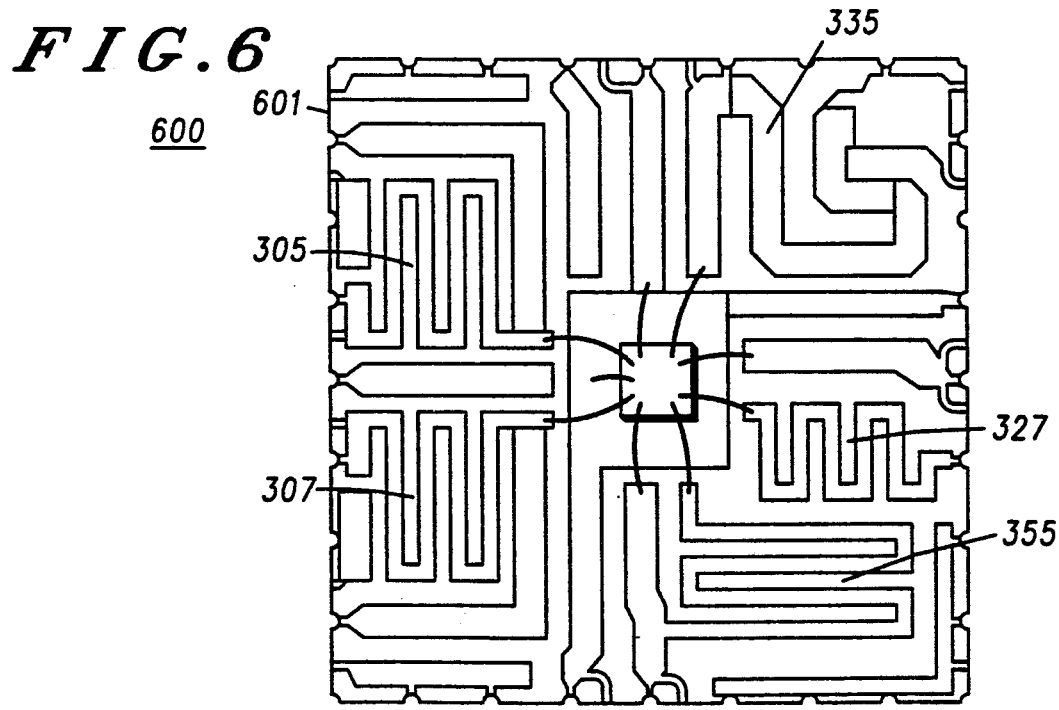
FIG. 6 is an illustration of a ceramic substrate containing a circuit die and inductive devices, which may employ the present invention.

In the preferred embodiment, the components of the circuit shown in FIG. 3 contained within the box 365 are integrated onto a circuit die. The connections from the die are indicated by the clear vias 363 in FIG. 3. The circuit die is mounted to a ceramic substrate as shown in FIG. 6. The ceramic substrate 601, provides connectivity paths between the components of the circuit not contained in the circuit die and the circuit die. The connectivity paths provide inductive and resonant elements for the circuits, namely, inductors 335, 327, 355, 305 and 307. The bias and resonating transistors 325, 333 are integrated into the circuit die, providing matching thermal characteristics for the transistors which assists in accurately controlling the bias current through the transistors 325, 333.

Therefore, eliminating the resistive elements from the emitter of the resonating transistor 333, using a stacked configuration, designing mirrored transistors 325, 333 in the VCO, integrating the transistors 325, 333 and coupling the resonator circuit to the emitter of the resonating transistor 333 has resulted in a power efficient, tightly controlled VCO for use in a radiotelephone with limited voltage supply.

We claim:

1. An oscillator for creating a signal having a predetermined frequency of at least 100 MHz, said oscillator comprising:
    means for generating the signal at the predetermined frequency including at least a first transistor and a resonant element, said first transistor having a bias current and an emitter, a base and a collector, said emitter having a first predetermined area and coupled to said resonant element; and means for creating said bias current for said first transistor, said means for creating said bias current including at least a second transistor having an emitter, said emitter having a second predetermined area, wherein said bias current is dependent upon a ratio of said first predetermined area to said second predetermined area.

2. An oscillator in accordance with claim 1 wherein said predetermined frequency is fixed.

3. An oscillator in accordance with claim 1 wherein said predetermined frequency is selectable.

4. An oscillator in accordance with claim 1 further comprising a first resistive element having a first and a second end, said first end of said resistive element coupled to said base of said second transistor, said second end of said resistive element coupled to an electrical ground, wherein said bias current is dependent upon a ratio greater than the ratio of said first predetermined area to said second predetermined area.

5. An oscillator in accordance with claim 1 wherein said oscillator further comprises an integrated circuit die including said first and second transistor and bonding to a ceramic substrate, said ceramic substrate providing connectivity paths from said integrated circuit to at least one external component, said connectivity paths providing at least one inductive and at least one resonant element of the oscillator, whereby said first and said second transistors have matching thermal characteristics.

6. An oscillator in accordance with claim 1 wherein said first and said second transistors are bipolar transistors.

7. An oscillator in accordance with claim 1 wherein said first and said second transistors are NPN type transistors.

8. An oscillator in accordance with claim 1 wherein said first and said second transistors have matching thermal characteristics.

9. An oscillator in accordance with claim 5 wherein said inductive element is coupled to said collector of said first transistor.

10. An oscillator in accordance with claim 5 wherein said inductive element is coupled to said base of said first transistor.

11. A voltage controlled oscillator (VCO) including a power supply, a resonant device, at least a first input signal and a first output signal having a voltage level, the VCO comprising:

a buffer amplifier coupled to and amplifying an output signal of the resonant device creating the first output signal of the VCO, said buffer amplifier deriving power from the power supply and substantially integrated into a circuit die;

the resonant device including at least a first transistor and an inductive element, said first transistor having a bias current, a base, a collector and an emitter, said emitter having a first predetermined area and coupled to said inductive element, said first transistor integrated into said circuit die and deriving power from said buffer amplifier;

means for creating said bias current for said first transistor, said means for creating said bias current including at least a second transistor having an emitter, said emitter having a second predetermined area, wherein said bias current is dependent upon a ratio of said first predetermined area to said second predetermined area and the voltage level of the first input signal, said means for creating said bias current integrated into said circuit die; and said circuit die coupled to a ceramic substrate, said ceramic substrate providing connectivity paths from said circuit die to at least one external component, said connectivity paths providing at least one inductive and at least one resonant element of the VCO.

12. A voltage controlled oscillator in accordance with claim 11 further comprising a first resistive element having a first and a second end, said first end of said first resistive element coupled to said base of said second transistor, said second end of said first resistive element coupled to an electrical ground, wherein said bias current is dependent upon a ratio greater than the ratio of said first predetermined area to said second predetermined area.

13. A voltage controlled oscillator in accordance with claim 11 wherein said first and said second transistors are bipolar transistors.

14. A voltage controlled oscillator in accordance with claim 11 wherein said first and said second transistors are NPN type transistors.

15. A voltage controlled oscillator in accordance with claim 11 wherein said first and said second transistor have matching thermal characteristics.

16. A radiotelephone including a transceiver, a stable reference source and a phase locked loop (PLL), the radio telephone comprising:

means for generating a first signal at a predetermined frequency greater than 100 MHz, said means for generating coupling to the PLL, the PLL is phase locked to the stable reference source, said means for generating including at least a first transistor having a bias current and a base, a collector and an emitter, said emitter having a first predetermined area and coupled to a first inductive element;

means for creating said bias current for said first transistor, said means for creating said bias current including at least a second transistor having an emitter, said emitter having a second predetermined area, wherein said bias current is dependent upon a ratio of said first predetermined area to said second predetermined area; and means for transmitting a radio frequency signal having a frequency dependent upon said predetermined frequency of said first signal.

17. A radiotelephone in accordance with claim 16 wherein said means for generating a first signal is substantially integrated into a circuit die, said circuit die including said first and said second transistors and bonding to a ceramic substrate, said ceramic substrate providing connectivity paths from said circuit die to at least the PLL, said connectivity paths providing at least one inductive and at least one resonant element of said means for generating.

18. A radiotelephone in accordance with claim 16 further comprising a first resistive element having a first and a second end, said first end of said first resistive element coupled to said base of said second transistor, said second end of said first resistive element coupled to an electrical ground, wherein said bias current is dependent on a ratio greater than the ratio of said first predetermined area to said second predetermined area.

19. A radiotelephone in accordance with claim 16 wherein said first and said second transistors are bipolar transistors.

20. A radiotelephone in accordance with claim 16 wherein said first and said second transistors are NPN type transistors.

21. A radiotelephone in accordance with claim 16 wherein said first and said second transistors have matching thermal characteristics.

22. A voltage controlled oscillator (VCO) including a power supply, a resonant device, at least a first input signal and a first output signal having a voltage level, the VCO comprising:

a buffer amplifier coupled to and amplifying an output signal of the resonant device creating the first output signal of the VCO, said buffer amplifier deriving power from the power supply and substantially integrated into a circuit die;

the resonant device including at least a first transistor and an inductive element, said first transistor having a bias current, a base, a collector and an emitter, said emitter having a first predetermined area, said inductive element coupled to said collector, said first transistor integrated into said circuit die and deriving power from said buffer amplifier;

means for creating said bias current for said first transistor, said means for creating said bias current including at least a second transistor having an emitter, said emitter having a second predetermined area, wherein said bias current is dependent upon a ratio of said first predetermined area to said second predetermined area and the voltage level of the first input signal, said means for creating said bias current integrated into said circuit die; and said circuit die coupled to a ceramic substrate, said ceramic substrate providing connectivity paths from said circuit die to at least one external component, said connectivity paths providing at least one inductive and at least one resonant element of the VCO.

23. A voltage controlled oscillator (VCO) including a power supply, a resonant device, at least a first input signal and a first output signal having a voltage level, the VCO comprising:

a buffer amplifier coupled to and amplifying an output signal of the resonant device creating the first output signal of the VCO, said buffer amplifier deriving power from the power supply and substantially integrated into a circuit die;

the resonant device including at least a first transistor and an inductive element, said first transistor having a bias current, a base, a collector and an emitter, said emitter having a first predetermined area, said inductive element coupled to said base, said first transistor integrated into said circuit die and deriving power from said buffer amplifier;

means for creating said bias current for said first transistor, said means for creating said bias current including at least a second transistor having an emitter, said emitter having a second predetermined area, wherein said bias current is dependent upon a ratio of said first predetermined area to said second predetermined area and the voltage level of the first input signal, said means for creating said bias current integrated into said circuit die; and said circuit die coupled to a ceramic substrate, said ceramic substrate providing connectivity paths from said circuit die to at least one external component, said connectivity paths providing at least one inductive and at least one resonant element of the VCO.

24. In an electrical circuit, an oscillator for generating an oscillating signal of a desired oscillating frequency, said oscillator comprising:

a die formed of a semiconductor material, said die having component circuit elements disposed therewithin, said component circuit elements disposed within the die comprise a first transistor and a second transistor, said first and second transistors having emitters, wherein relative sizes of the emitters of the first and the second transistors define a level of bias current applied to bias the first and second transistors; and a ceramic substrate bonded to the die and having at least one connectivity path coupled to the die for connecting desired ones of the component elements to desired portions of the electrical circuit, said at least one connectivity path comprised of a material and of a length to form at least one passive circuit element, such that the at least one passive circuit element formed thereby and the component circuit elements disposed within the die together form an oscillating circuit which generates said oscillating signal of the desired oscillating frequency at an output port of the oscillating circuit.

25. The oscillator of claim 24 further comprising an inductor connected between the emitter of the first transistor and a ground plane.

* * * * *